United States Patent
Wang et al.

(10) Patent No.: US 11,744,006 B2
(45) Date of Patent: Aug. 29, 2023

(54) METHOD AND DESIGN OF HIGH-PERFORMANCE INTERCONNECTS WITH IMPROVED SIGNAL INTEGRITY

(71) Applicant: University of South Carolina, Columbia, SC (US)

(72) Inventors: Guoan Wang, Irmo, SC (US); Jinqun Ge, West Columbia, SC (US)

(73) Assignee: University of South Carolina, Columbia, SC (US)

(*) Notice: Subject to any disclaimer, the term of this patent is extended or adjusted under 35 U.S.C. 154(b) by 0 days.

(21) Appl. No.: 17/329,285

(22) Filed: May 25, 2021

(65) Prior Publication Data
US 2021/0378089 A1  Dec. 2, 2021

Related U.S. Application Data

(60) Provisional application No. 63/030,456, filed on May 27, 2020.

(51) Int. Cl.
| | |
|---|---|
| *H05K 1/02* | (2006.01) |
| *H01L 21/768* | (2006.01) |
| *H01L 23/66* | (2006.01) |
| *H01L 23/64* | (2006.01) |

(52) U.S. Cl.
CPC ......... *H05K 1/0228* (2013.01); *H01L 21/768* (2013.01); *H01L 23/642* (2013.01); *H01L 23/66* (2013.01); *H05K 1/024* (2013.01); *H05K 1/025* (2013.01)

(58) Field of Classification Search
CPC ........................... H05K 1/024; H05K 1/0234
See application file for complete search history.

(56) References Cited

U.S. PATENT DOCUMENTS

| | | | | |
|---|---|---|---|---|
| 2004/0189528 A1* | 9/2004 | Killen | ............... | H01Q 9/0457 343/700 MS |
| 2004/0225807 A1* | 11/2004 | Leddige | ............... | H05K 1/117 710/305 |
| 2011/0181370 A1* | 7/2011 | Guilar | ............... | H04L 12/40032 333/1 |
| 2014/0177150 A1* | 6/2014 | Oluwafemi | ............... | H05K 1/0228 361/679.02 |

* cited by examiner

*Primary Examiner* — Jeremy C Norris
(74) *Attorney, Agent, or Firm* — Burr & Forman LLP; Douglas L. Lineberry

(57) ABSTRACT

Described herein are systems and methods for a design method and new interconnect structures with incorporated interdigital trapezoidal tabs structures enabled with materials with either larger permittivity or permeability for improved signal integrity.

14 Claims, 6 Drawing Sheets

Table 1 FEXT ($S_{31}$, dB) comparison of new structures, conventional tab-routing, and regular lines

| Frequency (GHz) | 1 | 3 | 5 | 7 | 9 | 11 | 13 | 15 |
|---|---|---|---|---|---|---|---|---|
| (a) Regular coupled lines | -26.60 | -17.68 | -13.57 | -10.79 | -8.75 | -7.19 | -5.93 | -4.95 |
| (b) Conventional tab-routing | -45.42 | -37.21 | -32.67 | -30.28 | -26.89 | -25.60 | -24.49 | -24.72 |
| (c) Dielectrics enabled tab-routing | -54.73 | -45.17 | -39.60 | -37.66 | -37.19 | -37.40 | -40.14 | -51.17 |
| (d) 3D tab-routing | -52.07 | -44.34 | -38.07 | -38.76 | -38.48 | -40.16 | -39.89 | -34.61 |
| (e) Magnetic film enabled tab-routing | -42.21 | -45.03 | -47.56 | -39.80 | -37.54 | -32.04 | -31.08 | -30.48 |

FIGURE 3

Table II Specific FEXT waveform magnitude versus time for different structures (V)

| Time (psec) | 250 | 260 | 270 | 280 | 290 |
|---|---|---|---|---|---|
| (a) Regular coupled lines | 0.069 | 0.095 | 0.081 | 0.037 | 0.005 |
| (b) Conventional tab-routing | 0.007 | 0.008 | 0.009 | 0.009 | 0.007 |
| (c) Dielectrics enabled tab-routing | 0.002 | 0.002 | 0.002 | 0.002 | 0.002 |
| (d) 3D tab-routing | 0.001 | 0.001 | 0.0003 | 0.00009 | 0.0004 |
| (e) Magnetic film enabled tab-routing | 0.0004 | 0.0003 | 0.001 | 0.002 | 0.003 |

FIGURE 6

METHOD AND DESIGN OF HIGH-PERFORMANCE INTERCONNECTS WITH IMPROVED SIGNAL INTEGRITY

TECHNICAL FIELD

The subject matter disclosed herein is generally directed to systems and methods for a design method and new interconnect structures with incorporated interdigital trapezoidal tabs structures enabled with materials with either larger permittivity or permeability for improved signal integrity.

BACKGROUND

Over the last few decades, there has been a progressively expanded tendency of increasing trace density on printed circuit boards (PCBs) and silicon dies. In the semiconductor industry, this is aimed at higher levels of integration and multi-core architecture, which generates chips with densities of hundreds of billions of transistors. Further pressures include low-cost and highly compact designs, such as miniaturized multiple input multiple-output systems. As a consequence, the signal switching frequency across a broad range of technologies is far beyond the gigahertz range. When the bandwidth requirement increases, the electrical properties of the interconnect effect and limit the integrity of the traveling digital signals. These phenomena have an impact on the electromagnetic compatibility (EMC) performance of the system since the corrupted signals can easily increase the unwanted electromagnetic interference (EMI).

How to make more compact integrated circuits with better performance is a challenge for the entire multi-billion IC industry. Accordingly, it is an object of the present disclosure to reduce crosstalk, especially far-end crosstalk (FEXT), at higher frequencies. The current disclosure will have wide applications to support current and future wireless communication systems providing products with improved performance, higher data transfer rate, and smaller size. The proposed methods herein will further increase the signal integrity of ICs and systems at high frequency by reducing the FEXT compared to the currently tabbed routing structures invented by Intel, which are widely used in the market.

Citation or identification of any document in this application is not an admission that such a document is available as prior art to the present disclosure.

SUMMARY

The above objectives are accomplished according to the present disclosure by providing a new interconnect structure for improved signal integrity. The interconnect structure may include an interconnect structure with an incorporated interdigital trapezoidal tab wherein at least one interdigital trapezoidal tab may be introduced between two microstrip traces by forming the at least one interdigital trapezoidal tab on one of the two microstrip traces and a gap is defined between the two microstrip traces, wherein the gap may be at least partially filled with a high permittivity dielectric material such that capacitive coupling is increased. Further, the dielectric material may be a film. Still, a thickness of the dielectric material may be equal to a thickness of the microstrip trace. Again, a thickness of the incorporated interdigital trapezoidal may be greater than a thickness of the microstrip traces. Further yet, at least one interdigital trapezoidal tab may be formed on both of the two microstrip traces. Again still, the interconnect structure may be incorporated into an integrated circuit or printed circuit board.

In a further embodiment, an interconnect structure may be provided with an incorporated interdigital trapezoidal tab wherein at least one interdigital trapezoidal tab may be introduced between two microstrip traces and a gap may be defined between the two microstrip traces and a magnetic film may be formed on an outer surface of the at least one interdigital trapezoidal tab and the two microstrip traces such that inductive coupling may be decreased. Further, the film may comprise Permalloy. Still, at least one interdigital trapezoidal tab may be formed on both of the two microstrip traces. Yet again, a thickness of the incorporated interdigital trapezoidal may be greater than a thickness of the microstrip traces. Furthermore, the interconnect structure may be incorporated into an integrated circuit or printed circuit board.

In a further embodiment, a method may be provided for reducing crosstalk at higher frequencies. The method may include forming an interconnect structure with two microstrip traces and at least one incorporated interdigital trapezoidal tab and forming the at least the at least one interdigital trapezoidal tab on one of the two microstrip traces and defining a gap between the two microstrip traces, wherein the gap may be at least partially filled with a high permittivity dielectric material such that capacitive coupling is increased. Further, the dielectric material may be a film. Still, the dielectric material may be formed to have a thickness equal to a thickness of at least one of the microstrip traces. Yet again, the incorporated interdigital trapezoidal tab may have a thickness greater than a thickness of the two microstrip traces. Still again, at least one interdigital trapezoidal tab may be formed on both of the two microstrip traces. Again yet, the interconnect structure may be incorporated into an integrated circuit or printed circuit board.

These and other aspects, objects, features, and advantages of the example embodiments will become apparent to those having ordinary skill in the art upon consideration of the following detailed description of example embodiments.

BRIEF DESCRIPTION OF THE DRAWINGS

An understanding of the features and advantages of the present disclosure will be obtained by reference to the following detailed description that sets forth illustrative embodiments, in which the principles of the disclosure may be utilized, and the accompanying drawings of which:

FIG. 5 shows Table 1, FEXT (S41, dB) comparison of new structures, conventional tab-routing, and regular lines.

FIG. 6 shows Table 2, Specific FEXT waveform magnitude versus time for different structures (V).

Figure 1:
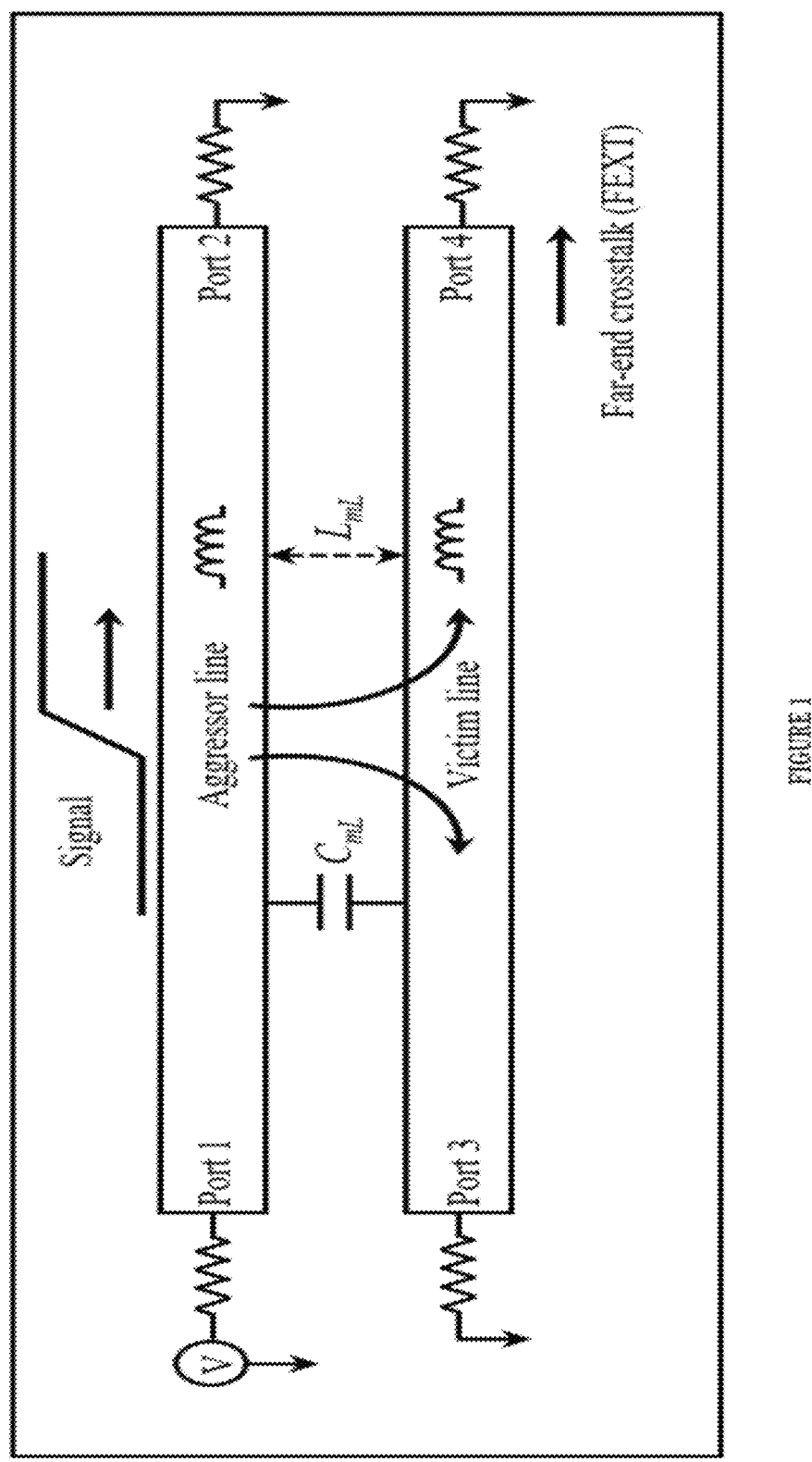
FIG. 1 shows illustrates electromagnetic interference (EMI).

The figures herein are for illustrative purposes only and are not necessarily drawn to scale.

DETAILED DESCRIPTION OF THE EXAMPLE EMBODIMENTS

Before the present disclosure is described in greater detail, it is to be understood that this disclosure is not limited to particular embodiments described, and as such may, of course, vary. It is also to be understood that the terminology used herein is for the purpose of describing particular embodiments only, and is not intended to be limiting.

Unless specifically stated, terms and phrases used in this document, and variations thereof, unless otherwise expressly stated, should be construed as open ended as opposed to limiting. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise.

Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are cited to disclose and describe the methods and/or materials in connection with which the publications are cited. All such publications and patents are herein incorporated by references as if each individual publication or patent were specifically and individually indicated to be incorporated by reference. Such incorporation by reference is expressly limited to the methods and/or materials described in the cited publications and patents and does not extend to any lexicographical definitions from the cited publications and patents. Any lexicographical definition in the publications and patents cited that is not also expressly repeated in the instant application should not be treated as such and should not be read as defining any terms appearing in the accompanying claims. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Where a range is expressed, a further embodiment includes from the one particular value and/or to the other particular value. The recitation of numerical ranges by endpoints includes all numbers and fractions subsumed within the respective ranges, as well as the recited endpoints. Where a range of values is provided, it is understood that each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure. For example, where the stated range includes one or both of the limits, ranges excluding either or both of those included limits are also included in the disclosure, e.g. the phrase "x to y" includes the range from 'x' to 'y' as well as the range greater than 'x' and less than 'y'. The range can also be expressed as an upper limit, e.g. 'about x, y, z, or less' and should be interpreted to include the specific ranges of 'about x', 'about y', and 'about z' as well as the ranges of 'less than x', less than y', and 'less than z'. Likewise, the phrase 'about x, y, z, or greater' should be interpreted to include the specific ranges of 'about x', 'about y', and 'about z' as well as the ranges of 'greater than x', greater than y', and 'greater than z'. In addition, the phrase "about 'x' to 'y'", where 'x' and 'y' are numerical values, includes "about 'x' to about 'y'".

It should be noted that ratios, concentrations, amounts, and other numerical data can be expressed herein in a range format. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. Ranges can be expressed herein as from "about" one particular value, and/or to "about" another particular value. Similarly, when values are expressed as approximations, by use of the antecedent "about," it will be understood that the particular value forms a further aspect. For example, if the value "about 10" is disclosed, then "10" is also disclosed.

It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to 5%" should be interpreted to include not only the explicitly recited values of about 0.1% to about 5%, but also include individual values (e.g., about 1%, about 2%, about 3%, and about 4%) and the sub-ranges (e.g., about 0.5% to about 1.1%; about 5% to about 2.4%; about 0.5% to about 3.2%, and about 0.5% to about 4.4%, and other possible sub-ranges) within the indicated range.

As used herein, the singular forms "a", "an", and "the" include both singular and plural referents unless the context clearly dictates otherwise.

As used herein, "about," "approximately," "substantially," and the like, when used in connection with a measurable variable such as a parameter, an amount, a temporal duration, and the like, are meant to encompass variations of and from the specified value including those within experimental error (which can be determined by e.g. given data set, art accepted standard, and/or with e.g. a given confidence interval (e.g. 90%, 95%, or more confidence interval from the mean), such as variations of +/−10% or less, +/−5% or less, +/−1% or less, and +/−0.1% or less of and from the specified value, insofar such variations are appropriate to perform in the disclosure. As used herein, the terms "about," "approximate," "at or about," and "substantially" can mean that the amount or value in question can be the exact value or a value that provides equivalent results or effects as recited in the claims or taught herein. That is, it is understood that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art such that equivalent results or effects are obtained. In some circumstances, the value that provides equivalent results or effects cannot be reasonably determined. In general, an amount, size, formulation, parameter or other quantity or characteristic is "about," "approximate," or "at or about" whether or not expressly stated to be such. It is understood that where "about," "approximate," or "at or about" is used before a quantitative value, the parameter also includes the specific quantitative value itself, unless specifically stated otherwise.

The term "optional" or "optionally" means that the subsequent described event, circumstance or substituent may or may not occur, and that the description includes instances where the event or circumstance occurs and instances where it does not.

As used interchangeably herein, the terms "sufficient" and "effective," can refer to an amount (e.g. mass, volume, dosage, concentration, and/or time period) needed to achieve one or more desired and/or stated result(s). For example, a therapeutically effective amount refers to an amount needed to achieve one or more therapeutic effects.

Various embodiments are described hereinafter. It should be noted that the specific embodiments are not intended as an exhaustive description or as a limitation to the broader aspects discussed herein. One aspect described in conjunction with a particular embodiment is not necessarily limited to that embodiment and can be practiced with any other embodiment(s). Reference throughout this specification to "one embodiment", "an embodiment," "an example embodiment," means that a particular feature, structure or characteristic described in connection with the embodiment is included in at least one embodiment of the present disclosure. Thus, appearances of the phrases "in one embodiment," "in an embodiment," or "an example embodiment" in various places throughout this specification are not necessarily all referring to the same embodiment, but may. Furthermore, the particular features, structures or characteristics may be combined in any suitable manner, as would be apparent to a person skilled in the art from this disclosure, in one or more embodiments. Furthermore, while some embodiments described herein include some but not other features included in other embodiments, combinations of features of different embodiments are meant to be within the scope of the disclosure. For example, in the appended claims, any of the claimed embodiments can be used in any combination.

All patents, patent applications, published applications, and publications, databases, websites and other published materials cited herein are hereby incorporated by reference to the same extent as though each individual publication, published patent document, or patent application was specifically and individually indicated as being incorporated by reference.

The current disclosure provides a design method and new interconnect structures with incorporated interdigital trapezoidal tab structures enabled with materials with either larger permittivity or permeability for improved signal integrity. Based on this tabbed routing structure, three effective methods are provided in this disclosure to counterpoise the difference between capacitive coupling and inductive coupling of neighbor interconnects for reduced FEXT crosstalk.

Three structures proposed in the current disclosure include: (1) Tab routing structure with dielectric material with high permittivity deposited and patterned in the selected area (gap) between interconnects; (2) Tab routing structure with tabs having larger thickness; and (3) Tab routing structure with magnetic film deposited and patterned on selected surfaces.

In integrated circuits (ICs), interconnects are structures that connect two or more circuit elements (such as transistors) together electrically. The design and layout of interconnects on an IC is vital to its proper function, performance, power efficiency, reliability, and fabrication yield. The material interconnects are made from depends on many factors. Chemical and mechanical compatibility with the semiconductor substrate, and the dielectric in between the levels of interconnect is necessary, otherwise barrier layers are needed. Suitability for fabrication is also required; some chemistries and processes prevent integration of materials and unit processes into a larger technology (recipe) for IC fabrication. In fabrication, interconnects are formed during the back-end-of-line after the fabrication of the transistors on the substrate.

Interconnects are classified as local or global interconnects depending on the signal propagation distance it is able to support. The width and thickness of the interconnect, as well as the material from which it is made, are some of the significant factors that determine the distance a signal may propagate. Local interconnects connect circuit elements that are very close together, such as transistors separated by ten or so other contiguously laid out transistors. Global interconnects can transmit further, such as over large-area sub-circuits. Consequently, local interconnects may be formed from materials with relatively high electrical resistivity such as polycrystalline silicon (sometimes silicided to extend its range) or tungsten. To extend the distance an interconnect may reach, various circuits such as buffers or restorers may be inserted at various points along a long interconnect.

For structures of the current disclosure, either the capacitive coupling is increased or the inductive coupling is decreased, which makes the FEXT approach zero. The signal integrity of the proposed interconnect structures is greatly improved in high speed integrate circuits (ICs) and communication systems.

To reduce crosstalk of high-density signal traces in integrated circuits and systems, one of the dominant limiting factors for achieving higher data transfer rate, this patent application provides a design method and new interconnect structures with incorporated interdigital trapezoidal tabs structures enabled with materials with either larger permittivity or permeability for improved signal integrity. Three effective methods and structures are proposed in this disclosure to reduce the interaction between the adjacent signal traces.

Within a limited space in integrated circuits and printed circuit boards, signal traces supporting a high data transfer rate are vulnerably subject to electric and magnetic coupling, leading to the far-end crosstalk (FEXT).

Crosstalk is the phenomenon by which a signal transmitted on one pair or one channel creates an undesired effect on another pair or channel. Crosstalk causes interference on an affected pair of conductors or overall cable creates errors or prevents data transmission. For example, have you ever heard someone else's conversation while on the phone? This is caused by interference between adjacent telephone wires.

Near end crosstalk (NEXT), is a performance parameter measured within a single link/channel. It measures the signal coupled from one pair to another. The pair causing the interference is referred to as the "disturbing pair" while the pair impacted by the crosstalk is the "disturbed pair."

NEXT is expressed in decibels (dB), and it varies with the frequency of the transmission since higher frequencies create more interference. The higher the dB value, the less crosstalk is received by the disturbed link/channel. For example, a Category 5e cable characterized to 100 MHz might have a NEXT value of 45.8 dB at 20 MHz and a NEXT value of 35.3 dB at 100 MHz, indicating better NEXT performance at the lower frequency.

The measurement is called "near end" because it measures crosstalk at the same end of the link/channel where the signal is sourced Pair twists are what help to cancel out NEXT—different twist rates on each pair prevent the pairs from picking up signals from adjacent pairs. This is why it is important to maintain pair twists as close to termination as possible. Twist rates are also optimized for crosstalk performance and isolation has improved with each category of cable. That's why a Category 6 cable characterized to 250 MHz has a NEXT value of 44.3 dB at 100 MHz compared to 35.3 dB for Category 5e at the same frequency.

Power sum near end crosstalk, abbreviated at PSNEXT, is simply a calculation that sums the NEXT measurement of all adjacent pairs. NEXT measures the crosstalk on each pair of a four-pair cable as affected by the other three pairs individually. PSNEXT is simply the sum of the crosstalk of all three adjacent pairs, and it's important because it tells us what the impact is on a pair when used in a network where all four pairs are transmitting signals (i.e., 1000BASE-T).

And last but not least, near end crosstalk testing includes PSACRN—power sum attenuation to crosstalk ratio, near end (previously called PSACR but renamed to distinguish it from PSACRF explained below). Calculated using PSNEXT and insertion loss values (see our previous 101 Series blog on insertion loss), it tell us the difference between each pair's attenuation and the combined crosstalk received from the other three pairs. The purpose is to ensure that received signals are strong enough in relation to the noise in the cable. The higher the PSACRN value, the better the performance.

Far end crosstalk, abbreviated FEXT, is also measured within a channel. It is a lot like NEXT but as its name infers, it is measured at the far end of the channel. However, by itself FEXT does not tell us much since signals are attenuated over distance.

To provide a more significant result, the attenuation (insertion loss) is removed from the FEXT result and referred to as equal level far end crosstalk (ELFEXT). In recent years, TIA renamed this parameter attenuation to crosstalk ratio, far-end, or ACRF for short.

Like NEXT, ACRF measurements are summed for each of the three disturbing pairs giving power sum ACRF (PSACRF). This PSACRF parameter used to be referred to as power sum ELFEXT (PSELFEXT) before the TIA renamed the parameter.

Interdigital trapezoidal tabs are introduced between two close microstrip traces to reduce the FEXT, which has been applied to actual products by companies such as Intel, Samsung, TI, etc. The performance of this tabbed routing structure can be further improved by the three new effective methods and structures proposed in this disclosure. More compact integrated circuits with higher data transfer rate and improved signal integrity can be achieved, resulting in much more competitive products.

In order to increase the data transfer rate of the signal channel between CPU and memory chips, Intel Company has already used the tabbed routing structures to reduce the FEXT in the double data rate (DDR) memory bus. The FEXT can be further eliminated by the proposed methods herein, leading to higher data transfer rate.

Within a limited space, signal traces at a high data transfer rate along with other closely placed active traces are vulnerably subject to electric and magnetic coupling, which is known as crosstalk. Nowadays, crosstalk has already become one of the dominant limiting factors for achieving higher data transfer rates. When interconnects are closed to each other, the capacitive coupling between adjacent signal lines is smaller than the inductive coupling, so that the far-end crosstalk (FEXT) occurs. As depicted in FIG. 1, signal line 100 is generally referred to as an aggressor line, and the neighbor line 102 is referred to as a victim line. The far-end crosstalk of the victim line is represented by:

$$FEXT = \frac{l}{RT} \times \frac{1}{2v} \times \left(\frac{C_{mL}}{C_L} - \frac{L_{mL}}{L_L}\right) \quad (1)$$

where l is the length of the coupled region between the two lines, RT is the rise time of the signal on the line, v is the signal speed, CmL is the mutual capacitance per length, CL is the capacitance per length of the signal trace, LmL is the mutual inductance per length, and LL is the inductance per length of the signal trace. Based on the mathematical formula, in order to reduce the FEXT, it is necessary to make the ratio of CmL to CL as close as the ratio of LmL to LL.

Figure 2:
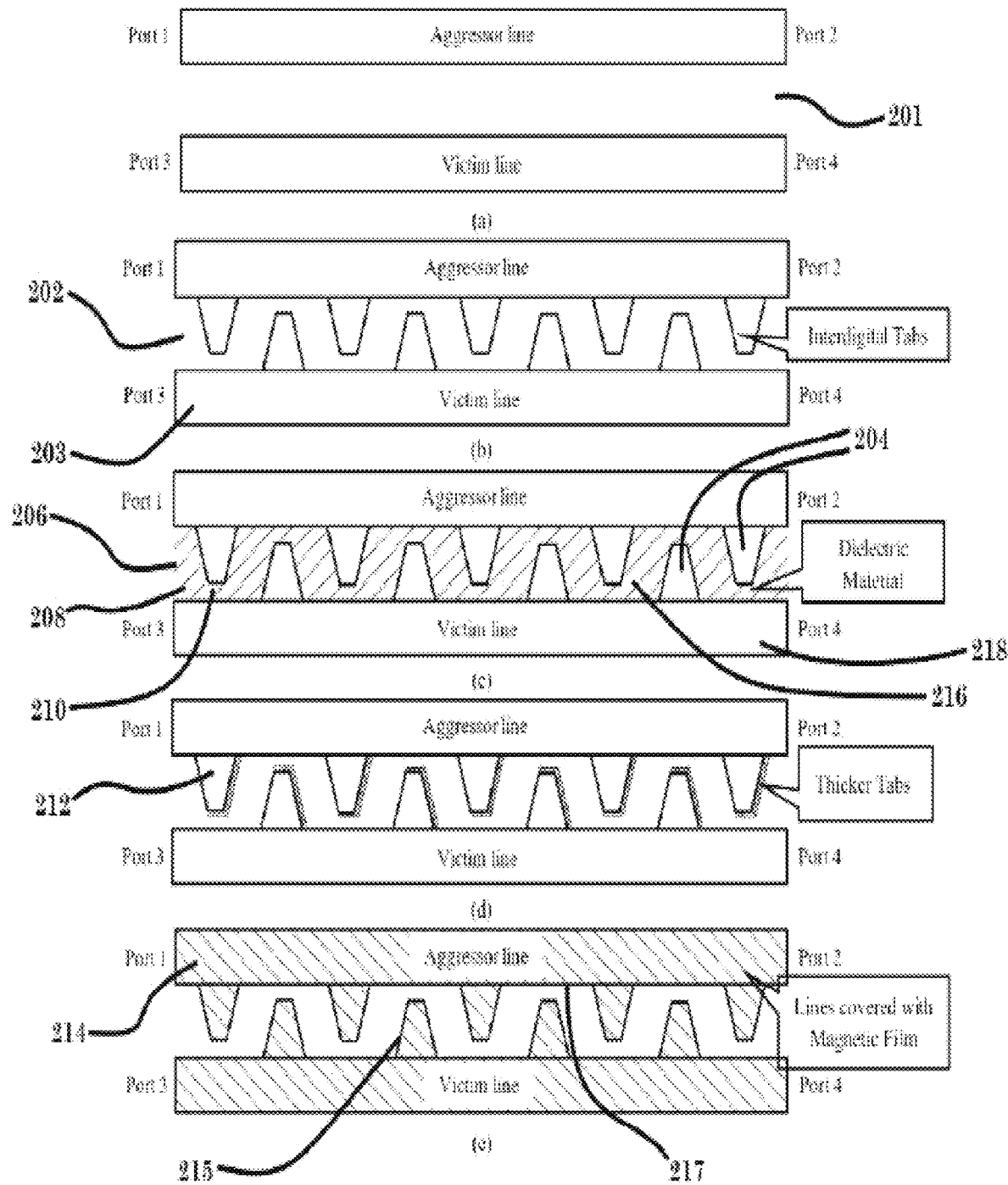
FIG. 2 shows at (a) Conventional microstrip transmission line structure; (b) Tab-routing structure invented by Intel; (c) New tab-routing structure with dielectric material between tabs for improved capacitive coupling; (d) New 3D tab-routing structure with thicker tab for improved capacitive coupling, (e) New tab-routing structure with covered magnetic material for improved magnetic coupling.

To reduce far-end crosstalk (FEXT), surface tab-routing 202 has been recently proposed by Intel Corporation for crosstalk mitigation to improve double data rate (DDR) channel performance as shown in FIG. 2 at (b). 201 shows two traces lying parallel to one another. When two microstrip traces are apart from each other with enough spacing, there is little crosstalk issue existing. Nevertheless, the FEXT degrades severely the received signal as the same traces get closer in highly compact PCBs. In order to overcome the obstacle and meet the demands of high-speed and high-density integration simultaneously, interdigital trapezoidal tabs are introduced between two closely coupled microstrip traces, which exhibit lower FEXT.

This disclosure provides a design method and new interconnect structures with incorporated interdigital trapezoidal tabs 204 structures enabled with materials 206 with either larger permittivity or permeability for improved signal integrity. Based on this tabbed routing structure, three effective methods are provided in this disclosure to counterpoise the difference between capacitive coupling and inductive coupling of neighbor interconnects for reduced FEXT. Three structures proposed in this disclosure includes: (1) Tab routing structure with high permittivity dielectric material 208 deposited and patterned in the selected area (gap) 210 between interconnects 203/tabs 204, see FIG. 2 at (c). The gap may be partially or completely filled, such as completely filled, a layer on the lines and tabs, or a layer partially filling the gap, indeed a dielectric film may be deposited on interconnects 203 and/or 204; (2) Tab routing structure with tabs having larger thickness 212, see FIG. 2 at (d); (3) Tab routing structure with magnetic film 214 deposited and patterned on selected surfaces such as outer surface 215 of trapezoidal tab 204 and/or outer surface 217 of interconnects 203, see FIG. 2 at (e). The film may cover all, substantially all, or only partially cover outer surfaces 215 and 217. The dielectric film may be an active or passive dielectric ceramic, mica, oxides, paper, glass, distilled water, transformer oil, etc.

Figure 3:
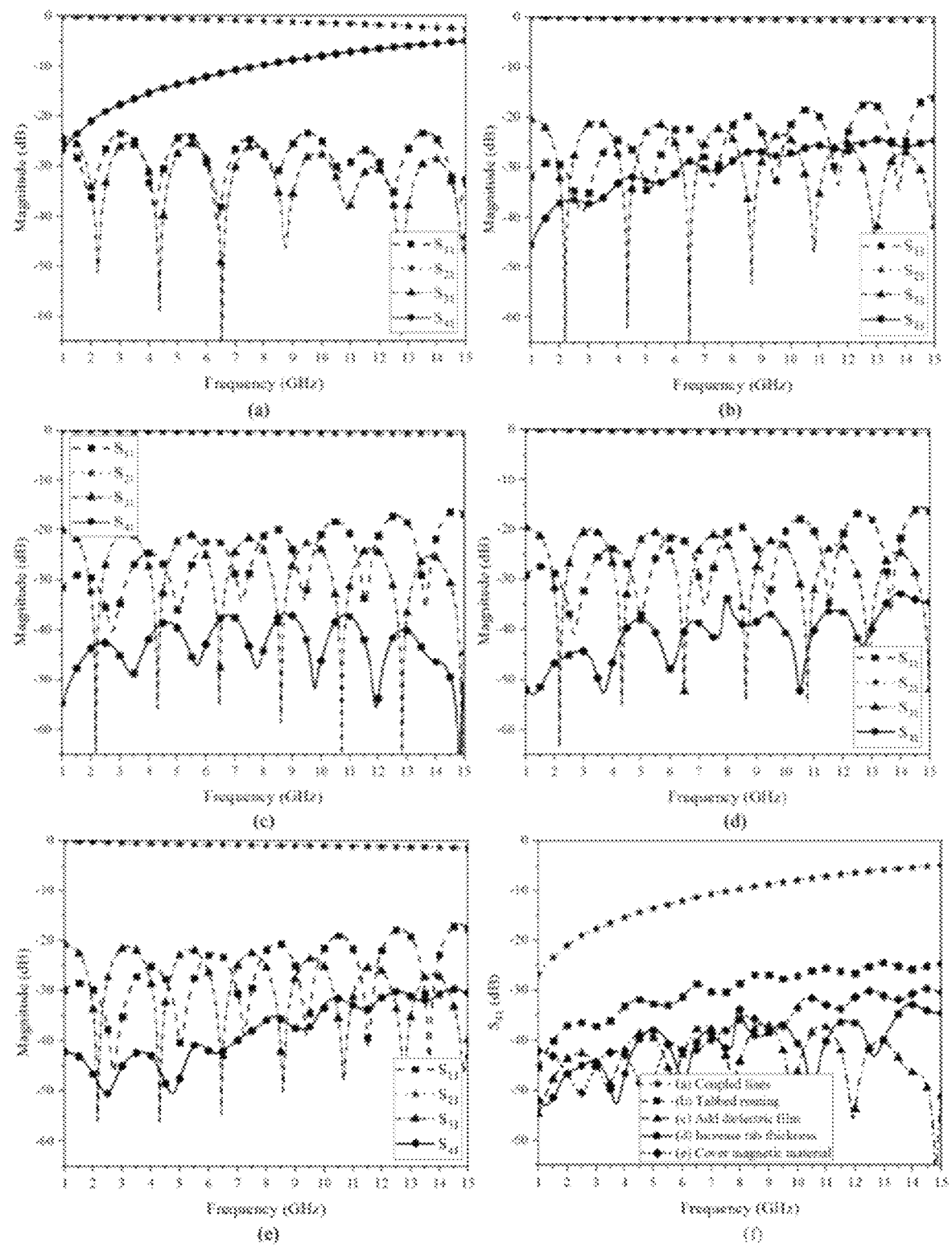
FIG. 3 shows simulated S-parameters.

For the current disclosure, either the capacitive coupling (structures 1 and 2) is increased or the inductive coupling (structure 3) is decreased, which makes the FEXT approach zero. As shown in FIG. 3, the signal integrity of the proposed interconnect structures is greatly improved in high speed integrate circuits (ICs) and communication systems.

FIG. 2 at (a)-(e) shows the structure of a conventional microstrip transmission lines, lines with interdigital tabs, and proposed new line structures with tabs enabled by 3D configuration and dielectric and magnetic thin films. As shown in FIG. 2 at (b), interdigital trapezoidal tabs 204 have been introduced between the two lines to increase the CmL, which exhibits lower far-end crosstalk. Based on this tabbed routing structure, three methods are proposed to further eliminate the FEXT in this disclosure. In the first method as illustrated in FIG. 2 at (c), dielectric films with higher permittivity than free space is deposited and patterned between the interdigital tabs to increase the mutual capacitive coupling of the two microstrip lines. The shaded part 216 in FIG. 2 at (c) shows a dielectric layer, which has the same thickness as the metal layer of the microstrip line or trace 218. The second method is shown in FIG. 2 at (d), mutual capacitance is increased by design tabs with thicker metal than line thickness itself, in particular, only the tab thickness is increased without changing the thickness of the original microstrip lines. In both methods, only CmL is increased while all the other component almost kept the same, providing less FEXT. FIG. 2 at (e) illustrates the third method to reduce the FEXT by covering magnetic material with 5 μm thickness over the metal lines, but the thickness may be greater than 5 μm. Magnetic film (e.g., Permalloy ($\varepsilon_1$=1, $\mu_r$=2000 and conductivity is $1.2e^7$S/m)) is employed to increase the self-inductance of the two microstrip lines.

All the structures as shown in FIG. 2 at (a)-(e) have been designed and simulated. The lines are implemented on the same the substrate of Rogers RO4350 ($\varepsilon r$=3.66, tan $\delta$=0.004), and the length of lines is 40 mm and the gap between the two lines is 1.2 mm. The width of the lines is set as 1.08 mm to achieve 50Ω characteristic impedance. Full-wave electromagnetic simulation software ANSYS HFSS is employed to simulate the above structures in FIG. 2. Far-end crosstalk (FEXT) on the victim line is represented by scattering parameter S41 (dotted solid line in FIG. 0.3 at (a)-(e)). The simulated S-parameters of FIG. 2 at (a)-(e) are presented in FIG. 3 at (a)-(e), respectively. FIG. 3 at (f) also compares the FEXT (S41) of the above cases for an intuitive illustration. It is noted that the tab-routing structure (case of FIG. 2 at (b)) has a smaller FEXT than the original coupled microstrip lines (case of FIG. 2 at (b)). In addition, the proposed methods (case of FIG. 2 at (c)-(e)) can further eliminate the FEXT based compared to the current tab-routing structures. To clearly show the performance improvement of FEXT of the proposed novel methods and structures, FEXT (S41) at selected frequencies are listed in Table I, see FIG. 5, where the advantages of the proposed three methods are obvious.

Figure 4:
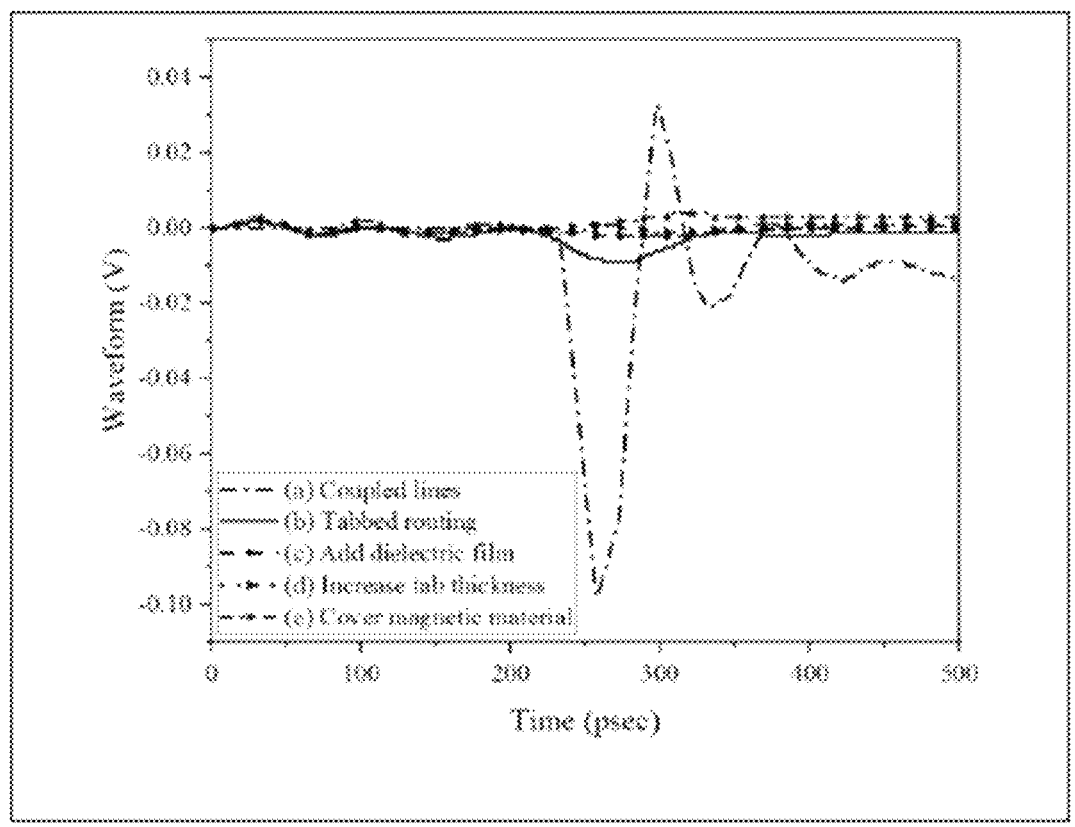
FIG. 4 shows FEXT voltage waveforms by the transient simulation in ADS.

Transient simulations have also been done in Advanced Design System (ADS) to show the performance improvement of the proposed methods. A rising waveform 103, as shown in the insert of FIG. 1, is chosen as the signal propagating from port 1 to port 2 in the aggressor line. The signal voltage rises form 0 V to 0.5V with a rise time of 40 psec, and is applied to the above structures with the same dimensions. FEXT voltage waveforms are measured at the end of the victim lines (Port 4) and compared among different structures in FIG. 4. It is noted that the original regular coupled lines have the largest peak FEXT, while the conventional tab-routing structure has decreased peak FEXT. In addition, the proposed three methods in this disclosure has peak FEXT much closer to zero compared to the regular tab-routing structure. The results are summarized in Table II, see FIG. 6, where the specific FEXT voltage magnitude of the above structures are presented at selected times.

Various modifications and variations of the described methods, pharmaceutical compositions, and kits of the disclosure will be apparent to those skilled in the art without departing from the scope and spirit of the disclosure. Although the disclosure has been described in connection with specific embodiments, it will be understood that it is capable of further modifications and that the disclosure as claimed should not be unduly limited to such specific embodiments. Indeed, various modifications of the described modes for carrying out the disclosure that are obvious to those skilled in the art are intended to be within the scope of the disclosure. This application is intended to cover any variations, uses, or adaptations of the disclosure following, in general, the principles of the disclosure and including such departures from the present disclosure come within known customary practice within the art to which the disclosure pertains and may be applied to the essential features herein before set forth.

What is claimed is:

1. A new interconnect structure for improved signal integrity comprising:
   an interconnect structure with an incorporated interdigital trapezoidal tab wherein at least one interdigital trapezoidal tab is introduced between two microstrip traces by forming the at least one interdigital trapezoidal tab on one of the two microstrip traces;
   wherein a gap is defined between the two microstrip traces, wherein the gap is at least partially filled with a high permittivity dielectric material such that capacitive coupling is increased; and
   wherein a thickness of the incorporated interdigital trapezoidal is greater than a thickness of the microstrip traces.

2. The interconnect structure of claim 1, wherein the dielectric material is a film.

3. The interconnect structure of claim 1, wherein a thickness of the dielectric material is equal to a thickness of the microstrip trace.

4. The interconnect structure of claim 1, wherein at least one interdigital trapezoidal tab is formed on both of the two microstrip traces.

5. The interconnect structure of claim 1, wherein the interconnect structure is incorporated into an integrated circuit or printed circuit board.

6. An interconnect structure with an incorporated interdigital trapezoidal tab wherein at least one interdigital trapezoidal tab is introduced between two microstrip traces; and wherein a gap is defined between the two microstrip traces and a magnetic film is formed on an outer surface of the at least one interdigital trapezoidal tab and the two microstrip traces such that inductive coupling is decreased; and wherein a thickness of the incorporated interdigital trapezoidal is greater than a thickness of the microstrip traces.

7. The interconnect structure of claim 6, wherein the film comprises Permalloy.

8. The interconnect structure of claim 6, wherein at least one interdigital trapezoidal tab is formed on both of the two microstrip traces.

9. The interconnect structure of claim 6, wherein the interconnect structure is incorporated into an integrated circuit or printed circuit board.

10. A method for reducing crosstalk at higher frequencies comprising:

forming an interconnect structure with two microstrip traces and at least one incorporated interdigital trapezoidal tab;

forming the at least the at least one interdigital trapezoidal tab on one of the two microstrip traces; and defining a gap between the two microstrip traces, wherein the gap is at least partially filled with a high permittivity dielectric material such that capacitive coupling is increased; and further comprising forming the incorporated interdigital trapezoidal tab to have a thickness greater than a thickness of the two microstrip traces.

11. The method of claim 10, further comprising forming the dielectric material as a film.

12. The method of claim 10, further comprising forming the dielectric material to have a thickness equal to a thickness of at least one of the microstrip traces.

13. The method of claim 10, further comprising forming at least one interdigital trapezoidal tab on both of the two microstrip traces.

14. The method of claim 10, further comprising incorporating the interconnect structure into an integrated circuit or printed circuit board.

* * * * *